(12) United States Patent
Nagata et al.

(10) Patent No.: US 10,444,015 B2
(45) Date of Patent: Oct. 15, 2019

(54) SENSOR FOR DETECTING ANGULAR VELOCITY

(71) Applicant: KYOCERA Corporation, Kyoto-shi, Kyoto (JP)

(72) Inventors: Masaru Nagata, Kyoto (JP); Tokuichi Yamaji, Kyoto (JP); Shigeo Tanahashi, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 153 days.

(21) Appl. No.: 15/125,696

(22) PCT Filed: Mar. 19, 2015

(86) PCT No.: PCT/JP2015/058216
§ 371 (c)(1),
(2) Date: Sep. 13, 2016

(87) PCT Pub. No.: WO2015/141771
PCT Pub. Date: Sep. 24, 2015

(65) Prior Publication Data
US 2017/0003130 A1    Jan. 5, 2017

(30) Foreign Application Priority Data

Mar. 20, 2014 (JP) .................. 2014-057963

(51) Int. Cl.
*G01P 15/12* (2006.01)
*G01P 15/18* (2013.01)
(Continued)

(52) U.S. Cl.
CPC ........ *G01C 19/5762* (2013.01); *B81B 3/0048* (2013.01); *G01P 15/123* (2013.01);
(Continued)

(58) Field of Classification Search
CPC .... G01P 15/123; G01P 15/18; G01P 15/0802; G01P 15/08
See application file for complete search history.

(56) References Cited

U.S. PATENT DOCUMENTS 7,574,914 B2 * 8/2009 Mochida ............... G01P 15/123
73/509
7,631,559 B2 * 12/2009 Mochida ............. G01P 15/0802
73/509
(Continued)

FOREIGN PATENT DOCUMENTS

EP        1643255 A2    4/2006
JP      11-271064 A    10/1999
(Continued)

OTHER PUBLICATIONS

International Search Report, PCT/JP2015/058216, dated Apr. 28, 2015, 2 pgs.
(Continued)

*Primary Examiner* — Helen C Kwok
(74) *Attorney, Agent, or Firm* — Volpe and Koenig, P.C.

(57) ABSTRACT

A sensor includes a weight body, a frame which is located so as to surround the weight body when viewed from above, a beam part which is provided with flexibility and in which a first end is connected to the weight body and a second end is connected to the frame, and a detection part which is provided on the beam part and detects deformation of the beam part as an electric signal. The beam part includes a main part in which a cross-sectional shape in a direction perpendicular to a longitudinal direction connecting the first end and the second end is a rectangular shape, and an extending part which protrudes from at least one of an upper surface or a lower surface of the main part and extends in the longitudinal direction or extends in a width direction per- (Continued)

pendicular to the longitudinal direction when viewed from above.

14 Claims, 10 Drawing Sheets

(51) Int. Cl.
*G01C 19/5762* (2012.01)
*B81B 3/00* (2006.01)
*G01P 15/08* (2006.01)

(52) U.S. Cl.
CPC ...... *G01P 15/18* (2013.01); *B81B 2201/0242* (2013.01); *B81B 2203/019* (2013.01); *B81B 2203/0154* (2013.01); *G01P 2015/0857* (2013.01)

(56) References Cited

U.S. PATENT DOCUMENTS

| | | | |
|---|---|---|---|
| 2003/0057447 A1 | 3/2003 | Saitoh et al. | |
| 2004/0123664 A1* | 7/2004 | Ohtoyo | B81B 3/0072 73/514.33 |
| 2004/0261529 A1* | 12/2004 | Yoshida | G01P 15/0802 73/514.33 |
| 2005/0217378 A1 | 10/2005 | Ishikawa et al. | |
| 2006/0130577 A1* | 6/2006 | Kai | G01P 15/123 73/504.14 |
| 2008/0211041 A1* | 9/2008 | Nomura | G01P 15/0802 257/415 |
| 2008/0271535 A1* | 11/2008 | Hattori | G01P 15/123 73/514.33 |
| 2009/0282918 A1* | 11/2009 | Maekawa | B81B 3/0078 73/514.33 |
| 2010/0218607 A1* | 9/2010 | Kazama | G01P 15/123 73/514.33 |
| 2011/0146404 A1* | 6/2011 | Jeung | G01C 25/005 73/514.34 |
| 2012/0031186 A1* | 2/2012 | Classen | B81B 3/0045 73/514.32 |
| 2012/0152020 A1* | 6/2012 | Kim | G01P 15/09 73/514.32 |
| 2013/0340527 A1* | 12/2013 | Konishi | G01P 15/123 73/514.33 |
| 2015/0059477 A1* | 3/2015 | Kim | G01P 15/123 73/514.33 |
| 2015/0135834 A1* | 5/2015 | Kim | G01P 15/09 73/514.36 |
| 2015/0260751 A1* | 9/2015 | Han | G01P 15/123 73/514.33 |

FOREIGN PATENT DOCUMENTS

| | | |
|---|---|---|
| JP | 2003-172745 A | 6/2003 |
| JP | 2005-283402 A | 10/2005 |
| JP | 2010-122141 A | 6/2010 |
| JP | 2010-139264 A | 6/2010 |
| WO | 2012-063818 A1 | 5/2012 |

OTHER PUBLICATIONS

The Extended European Search Report dated Jan. 24, 2018 for the European Application No. 15765000.3.

* cited by examiner

SENSOR FOR DETECTING ANGULAR VELOCITY

TECHNICAL FIELD

The present invention relates to a sensor capable of detecting an angular velocity.

BACKGROUND ART

In order to measure the running condition of an automobile, state of movement of a robot, or the like, use is made of an angular velocity sensor provided with a vibration type sensor element.

FIGS. 10A and 10B are views showing a conventional sensor element, in which FIG. 10A is a plan view, and FIG. 10B is a cross-sectional view taken along the line VI-VI in FIG. 10A.

The sensor element shown in the above figures has a weight part 101, a frame-shape fastening part 102 surrounding the weight part 101, beam parts 103 connecting the weight part 101 to the fastening part 102, and piezoresistive elements 104 formed on the beam parts 103.

The weight part 101, fastening part 102, and beam parts 103 are integrally formed by machining a silicon substrate. Further, the piezoresistive elements 104 are formed by implanting boron into the surface of the silicon substrate.

In such a sensor element, if an angular velocity around an axis of rotation parallel to the longitudinal direction of beam parts 103 is generated in a state where the beam parts 103 are made to vibrate, the weight part 101 moves. Along with that, the beam parts 103 deform, therefore the piezoresistive elements 104 deform.

The angular velocity is detected based on a change of the resistance value due to the deformation of these piezoresistive elements 104.

Accordingly, in order to improve the detection sensitivity of the angular velocity, the beam parts 103 may be made easier to deform. The trick in the past has been to make the volume of the weight part 101 larger (see for example Japanese Patent Publication No. 2003-172745).

This type of sensor element can detect the angular velocities in the three X-, Y-, and Z-axial directions by the piezoresistive elements 104 arranged on the beam parts 103 and the interconnects connected to those.

Further improvement of the detection sensitivity is being demanded from sensor elements. In order to improve the detection sensitivity, reduction of the variation of sensitivity in the three axial directions is effective.

The present invention was conceived of under the above circumstances and has as an object thereof to provide a sensor with small variation of sensitivity in the three axial directions.

SUMMARY OF INVENTION

A sensor according to one embodiment of the present invention is a sensor including a weight body, a frame which is located so as to surround the weight body when viewed from above, a beam part which is provided with flexibility and in which a first end is connected to the weight body and a second end is connected to the frame, and a detection part which is provided on the beam part and detects deformation of the beam part as an electric signal. Further, the beam part includes a main part in which a cross-sectional shape in a direction perpendicular to a longitudinal direction connecting the first end and the second end is a rectangular shape, and an extending part which protrudes from at least one of an upper surface or a lower surface of the main part and extends in the longitudinal direction or extends in a width direction perpendicular to the longitudinal direction when viewed from above.

A sensor according to another embodiment of the present invention is a sensor including a weight body, a frame which is located so as to surround the weight body when viewed from above, a beam part which is provided with flexibility and in which a first end is connected to the weight body and a second end is connected to the frame, and a detection part which is provided on the beam part and detects deformation of the beam part as an electric signal. Further, the beam part includes a main part which extends in a longitudinal direction connecting the first end and the second end, and an extending part which protrudes from the main part to at least one of the upper side or lower side. When using a member configured by only the main part as the standard, an amount of increase of a moment of inertia of area in a thickness direction of the beam part is larger than the amount of increase of the moment of inertia of area in a surface direction of the beam part.

DESCRIPTION OF EMBODIMENTS

One embodiment of a sensor of the present invention will be explained with reference to the drawings.

Figure 1:
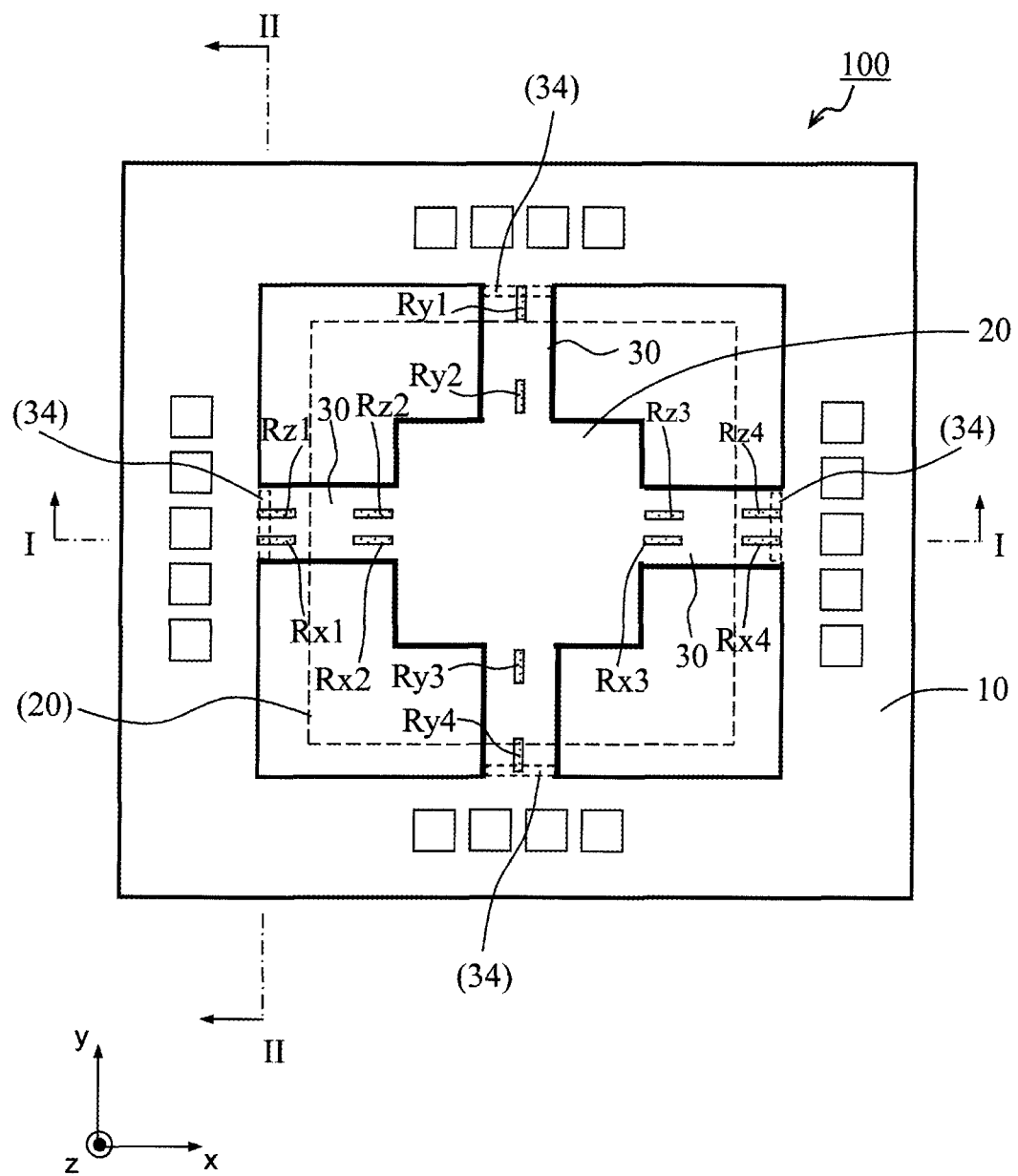
FIG. 1 is a plan view schematically showing the configuration of a sensor according to one embodiment of the present invention.
Figure 2:
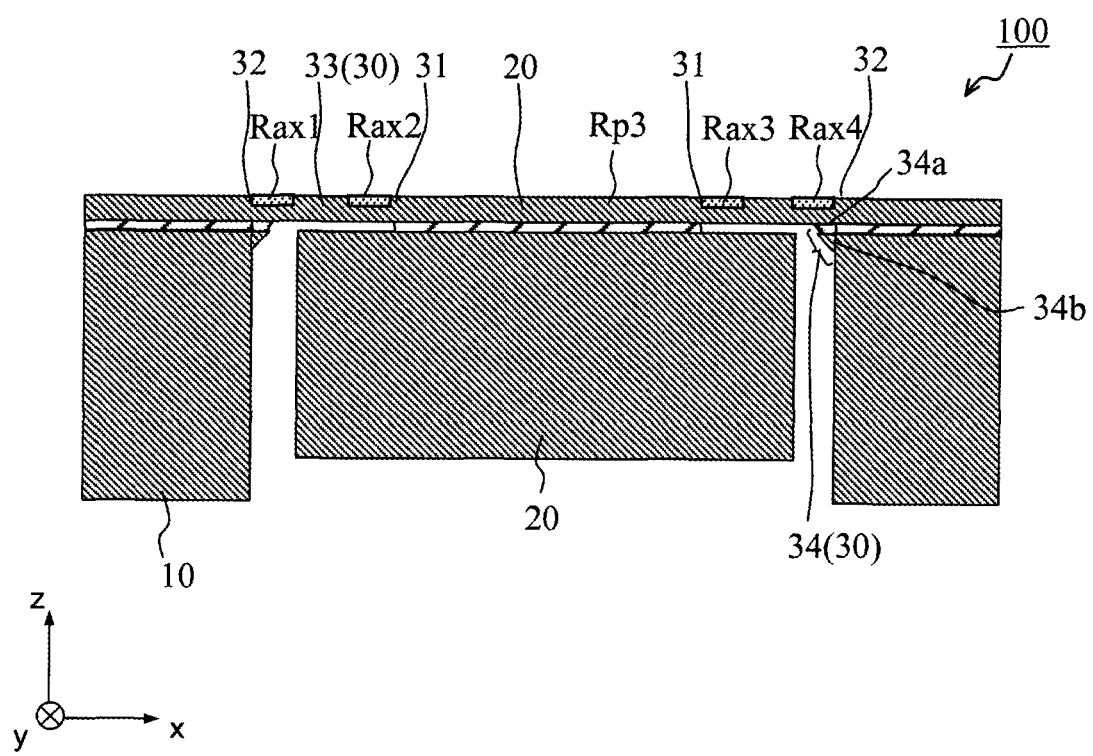
FIG. 2 is a cross-sectional view of the sensor in FIG. 1.
Figure 3:
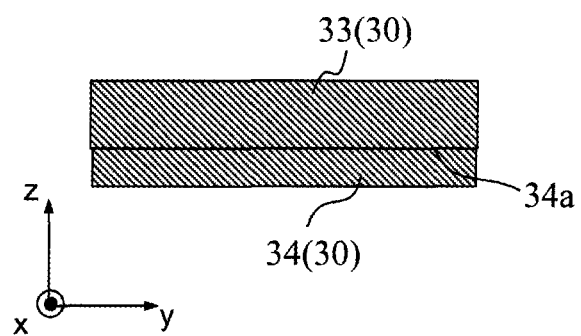
FIG. 3 is a cross-sectional view of the principal parts of a beam part of the sensor in FIG. 1.

FIG. 1 is a plan view of a sensor 100 according to one embodiment of the present invention, and FIG. 2 is a cross-sectional view taken along the line I-I in FIG. 1. Further, FIG. 3 is a cross-sectional view of principal parts of a beam part 30 taken along the line II-II in FIG. 1. The sensor 100 has a frame 10, a weight body 20 which is located inside the frame 10, beam parts 30 connecting the weight body 20 to the frame 10, and detection parts R which are arranged on the beam parts 30 and generate electric signals in accordance with deformation of the beam parts 30.

The sensor 100 can detect an angular velocity by making the weight body 20 engage in rotary motion within the XY plane. In order to make the weight body 20 engage in rotary motion, for example, the rotary motion may be realized by electrostatic attraction by providing electrodes on the outer wall of the weight body 20 and on the inner wall of the frame 10 which face each other or may be realized by generating a magnetic force at the outside of the sensor 100. Further, the rotary motion may be achieved by arranging drive-use piezoelectric elements on a plurality of beam parts 30 and inputting electric signals to these piezoelectric elements in order to successively deform the beam parts 30. When angular velocity is added to the sensor 100, a coriolis force acts upon the weight body 20, so the weight body 20 moves. Due to this, the beam parts 30 are deformed so as to twist. Further, by detecting the electric signals in accordance with the amounts of deformation of the beam parts 30 by the detection parts R, extracting the electric signals by not shown electrical lines, and carrying out operations, the angular velocity can be detected.

Note that, the sensor 100 can detect acceleration as well. When acceleration is applied to the sensor 100, a force in accordance with the acceleration acts upon the weight body 20, so the weight body 20 moves. Due to this, the beam parts 30 bend. Further, by detecting the electric signals in accordance with the amounts of deflection of the beam parts 30 by the detection parts R, extracting the electric signals by not shown electrical lines, and carrying out operations, the acceleration can be detected. Below, these parts will be explained in detail.

The weight body 20 has a substantially square planar shape. In the weight body 20 shown in this example, the portion connected to the beam parts 30 which will be explained later and the portion located beneath the beam parts 30 are given different planar shapes. The portion of the weight body 20 which is connected to the beam parts 30 and the portion located beneath them are arranged so that their centers are superimposed on each other. Note that, in FIG. 1, the planar shape of the portion which is located beneath is indicated by the broken lines.

The size of the portion of the weight body 20 which is connected to the beam parts 30 is set so that the length of a single side of the substantially square shape becomes for example 0.25 mm to 0.5 mm. Further, the thickness of this part is set to for example 5 µm to 20 µm. The size of the portion located beneath is set so that the length of one side of the substantially square shape becomes for example 0.4 mm to 0.65 mm. Further, the thickness thereof is set to for example 0.2 mm to 0.625 mm. In such a weight body 20, the portion connected to the beam parts 30 and the portion located beneath may be joined by another member as well. For example, in the weight body 20, the portion connected to the beam parts 30, the portion located beneath, and the joint portion joining the two may be integrally formed by machining an SOI (Silicon on Insulator) substrate. In this case, the joint portion is configured by an oxide layer between silicon (Si). The joint portion is given a planar shape which is schematically the same as the portion connected to the beam parts 30. Further, the planar shape of the joint portion becomes smaller compared with the portion located beneath. Due to this, the beam part 30 and the portion of the weight body 20 located beneath the beam parts 30 can be separated, therefore it becomes able to secure the movement of the weight body 20.

Further, the frame-shape frame 10 is provided so as to surround this weight body 20. The frame 10 has a substantially square planar shape and has substantially square-shaped opening a bit larger than the weight body 20 at its center part. In the frame 10, the length of one side thereof is set to for example 1.4 mm to 3.0 mm, and the width of an arm configuring the frame 10 (width in direction perpendicular to the longitudinal direction of the arm) is set to for example 0.3 mm to 1.8 mm. Further, the thickness of the frame 10 is set to for example 0.2 mm to 0.625 mm.

Between the frame 10 and the weight body 20, as shown in FIGS. 1 and 2, the beam parts 30 are provided. In each beam part 30, one end, a first end 31, is connected to the upper surface side center part of a side of the weight body 20, and the other end, a second end 32, is connected to the upper surface side center part of a side at an inner circumference of the frame 10. In the sensor 100 in the present embodiment, four beam parts 30 are provided. Two among the four beam parts 30 extend in the X-direction and are arranged on the same straight line while sandwiching the weight body 20 therebetween. The other two extend in the Y-direction and are arranged on the same straight line while sandwiching the weight body 20 therebetween. Note that, in the following description, the direction connecting the first end 31 and the second end 32 of the beam part 30 will be referred to as the "longitudinal direction". That is, in FIGS. 1 and 2, among the four beam parts 30, the longitudinal directions of two located on upper side (+Y side) and lower side (−Y side) of the weight body 20 are the Y-axis direction, and the longitudinal directions of two located on the right side (+X side) and left side (−X side) of the weight body 20 are the X-axis direction.

Further, each beam part 30 has a main part 33 and extending part 34. The main part 33 is an angular member having a rectangular cross-sectional shape in the cross-sectional direction vertical to the longitudinal direction of the beam part 30. Further, the extending part 34 is a part protruding from at least one of the upper surface or lower surface of the main part 33. This extending part 34 is arranged so as to extend in the longitudinal direction of the beam part 30 or extend in the width direction perpendicular to the longitudinal direction of the beam part 30 when viewed from above. Note that, as the width direction described above, the width direction of the beam part 30 is the Y-axis direction when the longitudinal direction of the beam part 30 is the X-axis direction, while the width direction of the beam part 30 is the X-axis direction when the longitudinal direction of the beam part 30 is the Y-axis direction. "Extension in the longitudinal direction" means a shape where the length of the longitudinal direction is longer than the length in the width direction. In the same way, "extension in the width direction" means a shape where the length of the width direction is longer than the longitudinal direction. Note that, FIGS. 1 to 3 show an example in which the extending part 34 extends in the width direction of the beam part 30.

Here, the beam part 30 is for example formed by machining an SOI substrate. That is, the main part 33 is formed by machining an Si layer, and the extending part 34 is formed by machining an oxide layer and an Si substrate called a "handle substrate" to desired shapes. Here, in the extending part 34, a bonding surface 34a with the main part 33 is configured by the upper surface of the oxide layer. Further, a portion of the oxide layer and a portion of the Si substrate configuring the SOI substrate extend from this bonding surface 34a toward the lower side. The portion of this oxide layer and the portion of the Si substrate can be used to form the extending part 34 to a desired shape.

Note that, in this example, the extending part 34 has a second bonding surface 34b which is joined with not only the main part 33, but also a side surface of the frame 10. Further, the bonding surface 34a and the second bonding surface 34b are continuously formed. Such a bonding surface 34a and second bonding surface 34b are not limited in their method of fastening so far as they are fastened to the main part 33 and frame 10. They may be fastened by integral formation as in the present example or may be fastened through an adhesive.

The beam part 30 has flexibility. When an angular velocity is applied to the sensor 100, the weight body 20 moves according to the coriolis force. Along with the movement of the weight body 20, torsion is generated in the beam part 30. The main part 33 of the beam part 30 is for example set so that the length in the longitudinal direction becomes 0.3 mm to 0.8 mm, the width (length of the direction perpendicular to the longitudinal direction) becomes 0.04 mm to 0.2 mm, and the thickness becomes 5 µm to 20 µm. By forming the beam part 30 long and thin in this way, deformation becomes possible, and flexibility is manifested.

Further, since the beam part 30 has flexibility as explained above, when an acceleration is applied to the sensor 100, the weight body 20 moves. Along with the movement of the weight body 20, the beam part 30 bends.

Here, the shape of the beam part 30 will be explained in detail. The beam part 30 is shaped so that the moment of inertia of area in the thickness direction is made large compared with an angular member in which the cross-sectional shape in the direction vertical to the longitudinal direction is uniform like the main part 33.

In order to make the moment of inertia of area different in this way, as shown in FIG. 2, the thickness is made greater at the first end 31 or second end 32 of the beam part 30. In this example, the thickness is made greater at the second end 32. That is, in the beam part 30, in this way, the thickness partially becomes greater at the portion at which the extending part 34 is arranged. By such a configuration, an asymmetric shape is formed in the Z-direction and the moment of inertia of area in the Z-direction is made large, therefore ease of deformation in the Z-direction can be lowered.

On the upper surfaces of the beam parts 30, as shown in FIG. 1, detection parts Rx1 to Rx4, Ry1 to Ry4, and Rz1 to Rz4 which are resistance elements are formed (below, when referring to these resistance elements together, they will be suitably represented by the notation R). The detection parts Rx1 to Rx4, Ry1 to Ry4, and Rz1 to Rz4 are formed at predetermined positions on the beam parts 30 and connected so as to configure a bridge circuit so that they can detect degrees of acceleration in the three axial directions (X-axis direction, Y-axis direction, and Z-axis direction in the three-dimensional orthogonal coordinate system shown in FIG. 1) and angular velocities around the three axes.

Such detection parts R can be formed by for example forming a resistor film by implanting boron into the uppermost layer of the SOI substrate, then patterning the resistor film to predetermined shapes by etching or the like. By this, detection parts R configured by piezoresistive elements can be formed.

When use is made of detection parts R configured by piezoresistive elements, the resistance values change in accordance with the deformation caused by bending or twisting of the beam parts 30. The change of the output voltage based on these changes of resistance values is extracted as an electric signal, which is arithmetically processed by an external IC. By going through such process, the direction and magnitude of the degree of acceleration which was applied, and the direction and magnitude of the angular velocity can be detected.

Note that, lines which are electrically connected from the detection parts R, pad electrodes for taking out these lines to the external IC etc., and so on are provided on the upper surfaces of the frame 10, weight body 20, or beam parts 30. Electric signals are taken out to the external portion and so on through them.

These lines are made of for example aluminum, aluminum alloy, or the like. These materials are sputtered or the like to form a film which is then patterned to predetermined shapes to form the lines on the upper surfaces of the frame 10, weight body 20, or beam parts 30.

According to the sensor 100 having such a configuration, a sensor with little variation in the detection sensitivity in three axes can be provided. The mechanism of this will be explained below.

Each beam part 30 is configured so as to deform in the Z-direction larger compared with the X- and Y-directions because of the shape, that is, the length of extension in the Z-direction being the smallest among the three axes, and of the method of fastening. That is, the resonance frequency in the Z-direction when making the beam part 30 vibrate is very different from the values in the X-direction and Y-direction and becomes a value much smaller than the values in the X-direction and Y-direction. Note that, it is confirmed that there is not that great a difference in the resonance frequency between the X-direction and the Y-direction.

Further, in the sensor 100, symmetry of the structure can be secured in the X- and Y-directions, but the structure becomes asymmetric in the Z-direction. It is guessed from this that the resonance frequency in the Z-direction is much different from the values in the X-direction and Y-direction.

From the above description, the resonance frequency of the vibration driven in order to detect the angular velocity (drive vibration) becomes a value different from those in the other directions only in the Z-direction. Here, it is known that, in an angular velocity sensor, the nearer the values of the frequency of the detection vibration and the frequency of the driven vibration, the higher the detection sensitivity. For this reason, in a sensor not provided with the extending parts 34, the sensitivity in the Z-direction ends up becoming different from those in the X-direction and Y-direction. Further, if the optimum frequencies are selected for the X-direction and Y-direction, the sensitivity in the Z-direction was liable to end up falling. Conversely, if the optimum frequency is selected for the Z-direction, the sensitivities in the X-direction and Y-direction were liable to end up falling.

Contrary to this, according to the sensor 100, by providing the extending parts 34, the moment of inertia of area in the Z-direction is raised. As a result, the resonance frequency in the Z-direction can be made to approach to the resonance frequencies in the X-direction and Y-direction. According to this, a sensor with a small variation of detection sensitivity in the three X-, Y-, and Z-axes can be obtained.

In particular, in the present embodiment, each beam part 30 is shaped so that the thickness gradually increases toward the frame 10 at the side joined with the frame 10, that is, the second end 32. Further, a second bonding surface 34b is provided for fastening with the frame 10. That is, at the root of the beam part 30, the resistance against displacement to the Z-direction is made larger. According to this, the displacement of the entire beam part 30 toward the Z-direction is suppressed, whereby the resonance frequency in the Z-direction can be raised.

Further, in the sensor 100, the frame 10, weight body 20, and beam parts 30 may be integrally formed as in the present embodiment. In this case, a sensor having a high strength and high reliability can be formed.

From the above description, according to the sensor 100 of the present embodiment, a sensor which is at least able to detect the angular velocity can be realized by a single structure without increase in size. In addition, a sensor having a high sensitivity and small variation of sensitivity in the three axial directions can be formed.

Note that, in the example explained above, an explanation was given by taking an example the case where the weight body 20 was made to engage in rotational motion in order to detect the angular velocity. However, only the beam parts 30 may be made to vibrate periodically as well.

(Modification of Extending Part 34)

In the example explained above, the extending part 34 was explained taking as an example the case where it was provided on the lower surface on the second end 32 side in the main part 33, but another configuration may be employed as well. For example, the extending part 34 may be provided on the first end 31 side or extending parts 34 may be provided on both of the first end 31 and second end 32 sides. Further, the extending part 34 may be provided only in the vicinity of the center part in the longitudinal direction other than the first end 31 side and second end 32 side as well.

Further, the example explained above showed the case where the extending part 34 was joined with not only the main part 33, but also the side surface of the frame 10, but it need not be joined with the side surface of the frame 10. Further, the extending part 34 may be located at the end part on the first end 31 side and joined also with the side surface of the weight body 20. When the extending part 34 is joined with the side surface of the frame 10 or when the extending part 34 is joined with the side surface of the weight body 20, the moment of inertia of area in the Z-direction can be raised more and the beam part 30 can be more effectively reinforced.

Figure 4A:
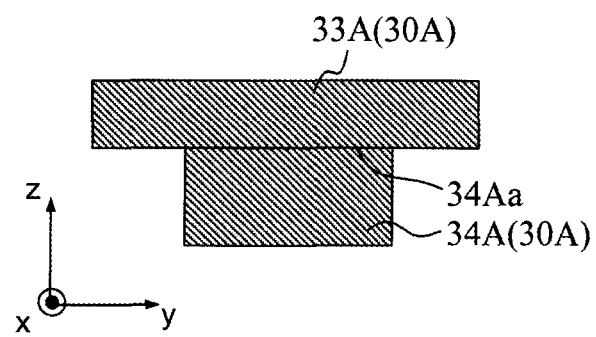
FIGS. 4A and 4B are cross-sectional views of the principal parts showing a modification of the beam part.
Figure 4B:
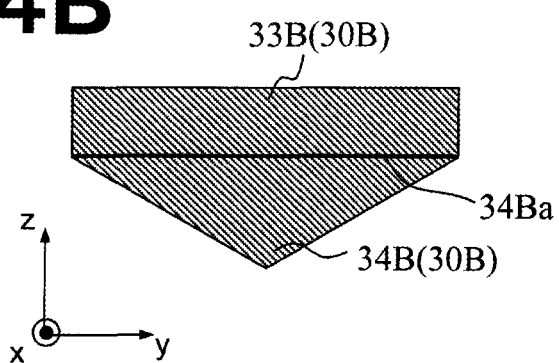

Further, the example explained above showed the case where the extending part 34 extended from one end part up to the other end part in the width direction of the main part 33. However, as shown by the beam part 30A shown in FIG. 4A, the extending part 34A may also be formed only at the center part (not reaching the end parts) in the width direction of the main part 33A. Further, as another example, as shown by the beam part 30B shown in FIG. 4B, the cross-section may be made a triangular shape other than the rectangular shape or may be made a polygonal shape other than that or a shape including a curve or other shape. Note that, FIG. 4A and FIG. 4B are cross-sectional views in directions the same as that in FIG. 3. That is, they show YZ cross-sections of the beam part 30A taken along the II-II line in FIG. 1.

Further, the example shown in FIG. 1 to FIG. 3 explained the case where the extending part 34 was formed in a region superimposed on the main part 33 when viewed from above, but the extending part 34 is not limited to this example. The extending part 34 may have a portion extending toward the outside of the region superimposed on the main part 33 as well.

Figure 5:
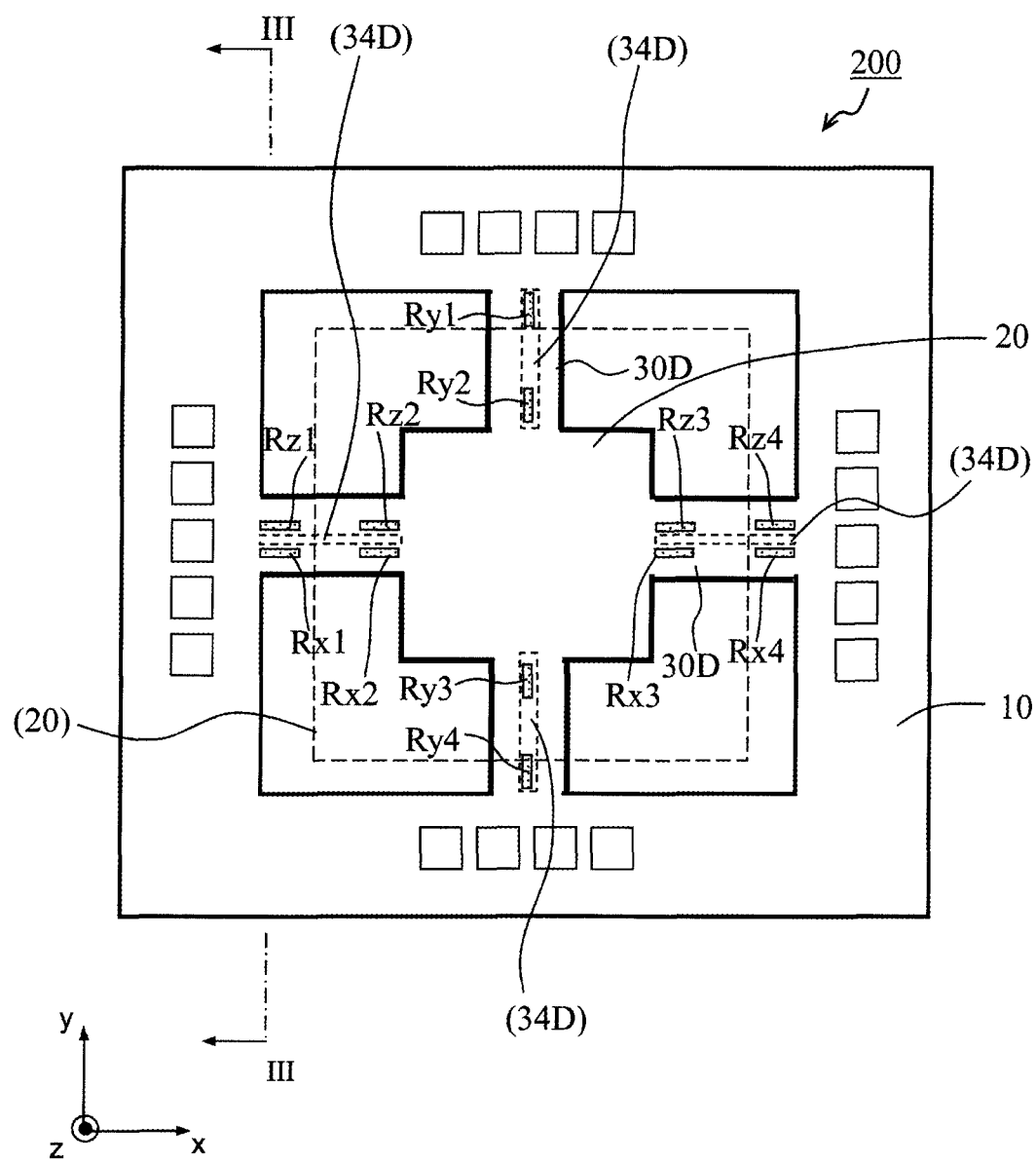
FIG. 5 is a plan view schematically showing the configuration of the modification of the sensor.
Figure 6:
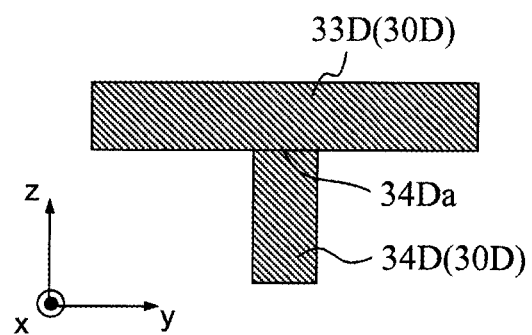
FIG. 6 is a cross-sectional view of the principal parts of the beam part of the sensor in FIG. 5.

Further, the example explained above showed the case where the extending part 34 extended in the width direction of the beam part 30. However, as shown in FIG. 5 and FIG. 6, the extending part 34D may extend in the longitudinal direction of the beam part 30D as well. FIG. 5 is a plan view of a sensor 200 as a modification. The same notations are attached to components having the same configurations as those in FIG. 1. Further, FIG. 6 is a cross-sectional view of the principal parts of the beam part 30D taken along the line III-III in FIG. 5. Note that, FIG. 5 showed the example where the extending part 34D extended from one end part (first end) up to the other end part (second end) in the longitudinal direction of the main part 33D, but the extending part 34D may be formed at only the center part (not reaching the first end and second end) in the longitudinal direction of the main part 33D as well.

(Modification of Beam Part 30)

The example explained above was explained by taking as an example the case where the cross-sectional shape on the surface vertical to the longitudinal direction of the main part 33 was uniform in the entire region in the longitudinal direction of the beam part 30, but it is not limited to this example. For example, there may be a part where the cross-sectional shape on the surface vertical to the longitudinal direction of the main part 33 is other than a rectangular shape as well. Further, the cross-sectional shape of the main part need not be constant either. For example, it may have a shape where the size of the rectangular cross-section changes as well.

By employing such a configuration, compared with the case where the beam part is formed by only an angular member like the main part 33 having a uniform cross-sectional shape, the moment of inertia of area in the surface direction can be made lower and the moment of inertia of area in the thickness direction can be made larger.

Figure 7A:
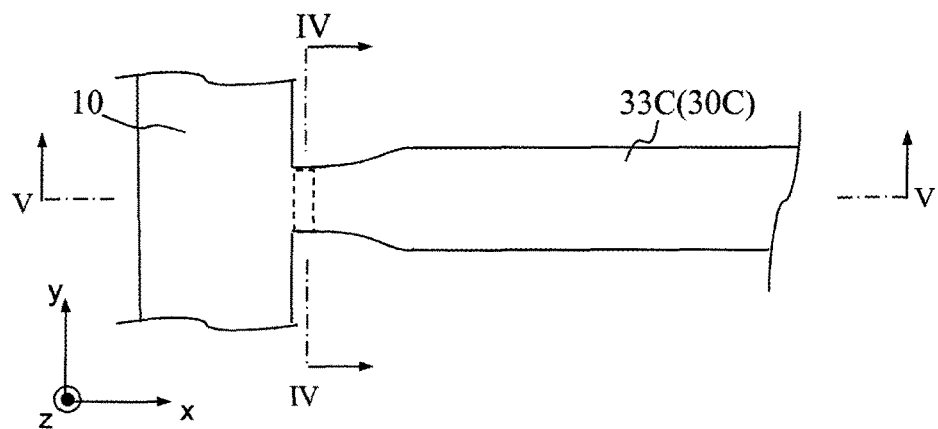
FIGS. 7A to 7C are top view of the principal parts and cross-sectional views of the principal parts showing the modification of the beam part.

An example of such a configuration will be explained by using FIGS. 7A to 7C. FIG. 7A is a top view of principal parts showing a modification of the beam part 30, FIG. 7B is a cross-sectional view of principal parts taken along the line IV-IV in FIG. 7A, and FIG. 7C is a cross-sectional view of principal parts taken along the line V-V in FIG. 7A.

Figure 7B:
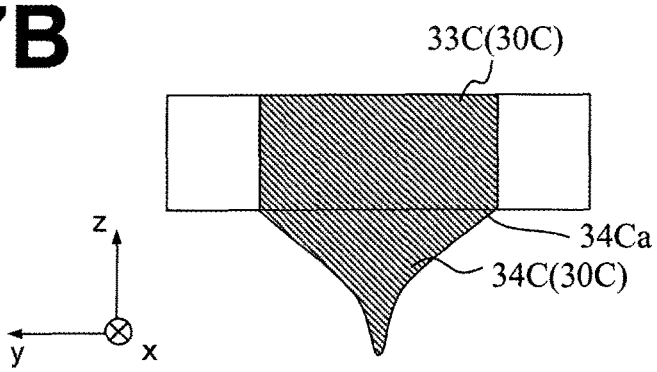
Figure 7C:
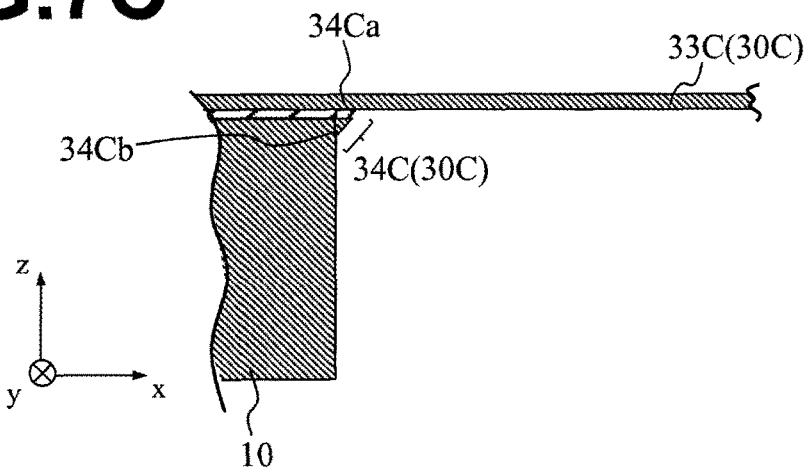

As shown in FIGS. 7A to 7C, the beam part 30C has a narrow width part which has a short length in the width direction at the end part on the second end 32 side (frame 10 side). According to this, the moment of inertia of area in the surface direction can be made smaller. Further, by an extending part 34C, the moment of inertia of area in the thickness direction is made larger. According to this, the moment of inertia of area in the surface direction having a large resonance frequency is made smaller, and the moment of inertia of area in the thickness direction having a small resonance frequency is made larger. By employing such a configuration, the resonance frequencies in the three axes can be approached, therefore it becomes possible to provide a sensor suppressing variation of sensitivity more. Note that, the narrow width part may be provided at the end part on the first end 31 side (weight body 20 side) as well. Further, as shown in FIGS. 7A to 7C, the narrow width part and the extending part 34C may be located at the same position at the beam part 30C as well and may be located at positions different from each other. When the narrow width part and the extending part 34C are located at the same position in the beam part 30C, the narrow width part can be reinforced by the extending part 34C.

Note that, this example was explained by taking as an example the case where the cross-sectional shape at the surface vertical to the longitudinal direction on the second end 32 side in the beam part 30C was made a rectangular shape as it was even though the area became smaller compared with the cross-sectional shape near the center, but may be for example a shape other than a rectangular shape where the shape of the side surface in the thickness direction sinks inwardly as well. Further, an example in which the extending part 34C extended from the main part 33C was shown, but it may extend from a portion having a shape other than a rectangular shape as well.

(Other Modifications)

In the example explained above, the weight body 20 was formed by machining an SOI substrate, but may be formed by connecting separate members as well. In that case, by using a material having a higher density, the force generated by acceleration can be made larger though the degree of acceleration is the same, and the deflection of the beam part 30 can be made larger along with that. According to this, a sensor having a further higher sensitivity can be provided.

Further, in the example explained above, the shape of the weight body 20 when viewed from above was made substantially a square, but the shape is not limited to this. For example, it may be a circular shape or rectangular state or may be a square shape to which accessory portions are added at the corner portions.

Further, the example explained above was explained by using the example where the detection parts R were formed by piezoresistance elements, but the detection parts R are not limited to this so far as they can detect deformation of the beam parts 30.

For example, it is also possible to form the detection parts R as electrodes and use the changes of the static capacitances to detect the magnitude of bending/deformation of the beam parts 30 or the direction of bending/deformation as electric signals. In this case, fastening parts are provided which are arranged spaced apart from the beam parts 30 and electrodes are provided facing the detection parts R at the fastening parts. Further, an electrode on the fastening part side and a detection part R may be made to function as a pair of electrodes, and the static capacitance may be measured.

Further, the example explained above was explained by taking as an example the case where all of the extending parts 34 were located on the lower side from the lower surfaces of the main parts 33, but they may be located on the upper side from the upper surfaces as well.

Further, the example explained above showed the case where the extending part 34 had a rectangular cross-sectional shape in the direction vertical to the longitudinal direction, but the extending part 34 is not limited to this. That is, it is enough that the beam part has the main part extending in the longitudinal direction and the extending part protruding from the main part to at least one of the upper side or lower side and is configured so that, when using a member configured by only the main part as the standard, the amount of increase of the moment of inertia of area in the thickness direction of the beam part becomes larger than the amount of increase of the moment of inertia of area in the surface direction of the beam part. As the shape of the extending part in this case as well, various shapes of extending part explained above can be employed as well.

<Method for Producing Sensor 100>

Next, a method for producing the sensor 100 explained above will be explained by using FIGS. 8A to 8C to FIG. 9.

Figure 8A:
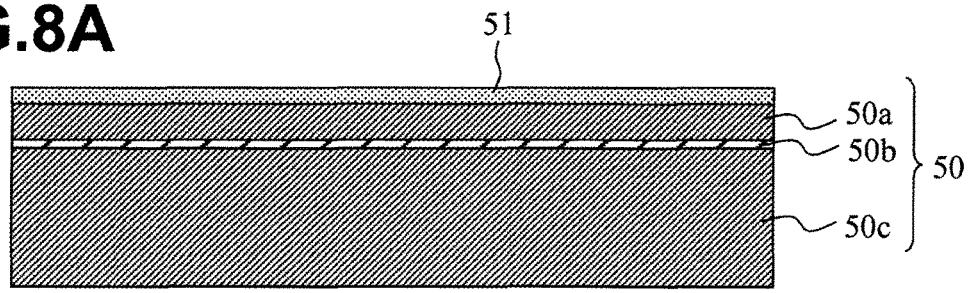
FIGS. 8A to 8C are a plan view and cross-sectional views showing the steps of a method for producing a sensor according to one embodiment of the present invention.
Figure 8B:
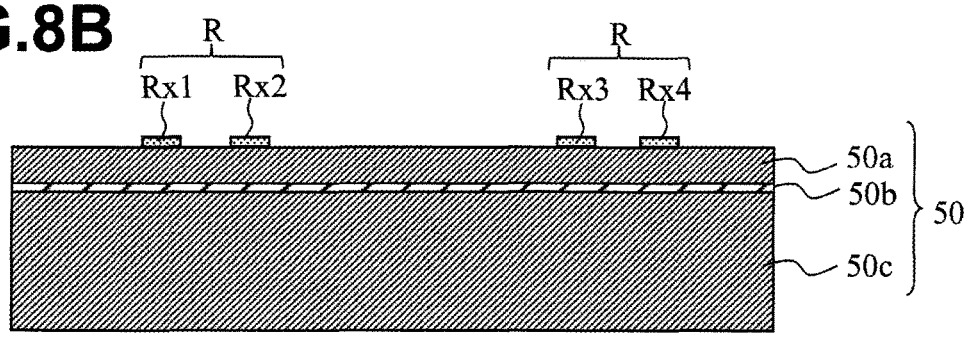
Figure 8C:
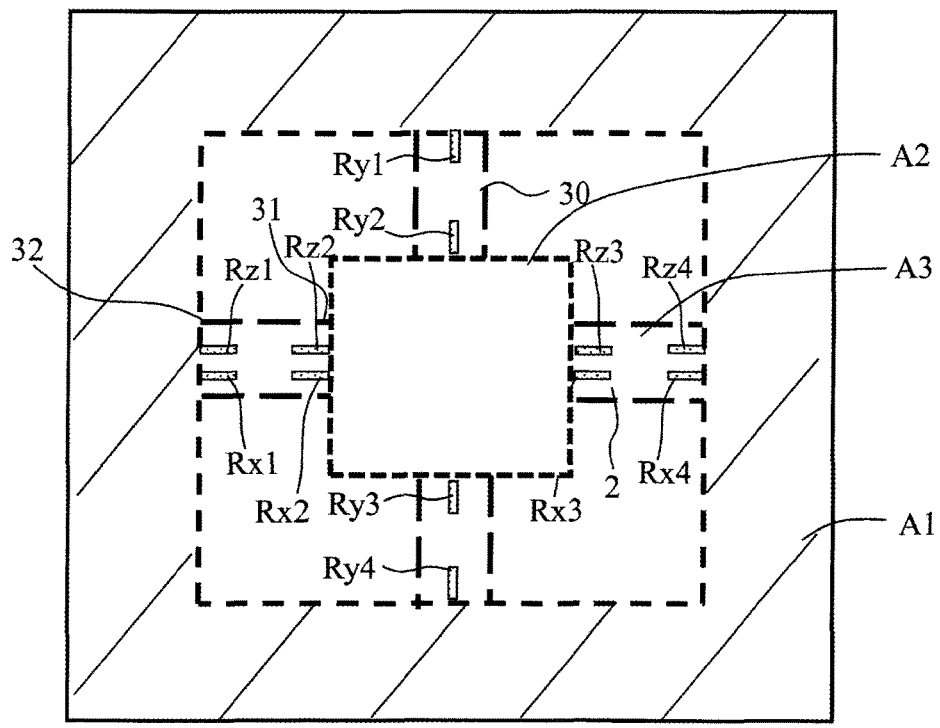
Figure 9:
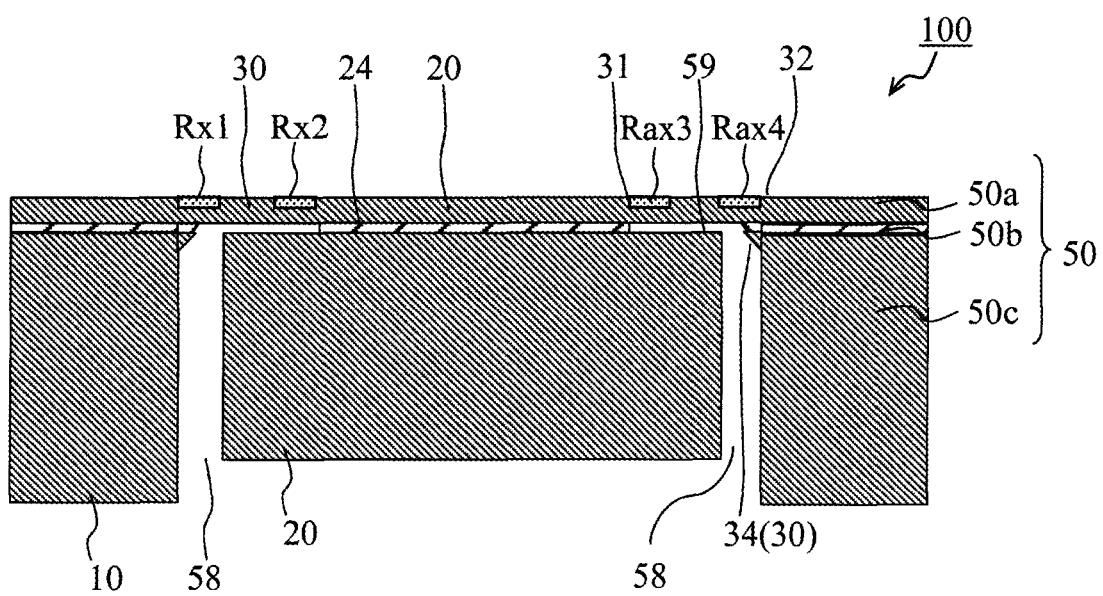
FIG. 9 is a cross-sectional view showing steps continued from FIGS. 8A to 8C.
Figure 10A:
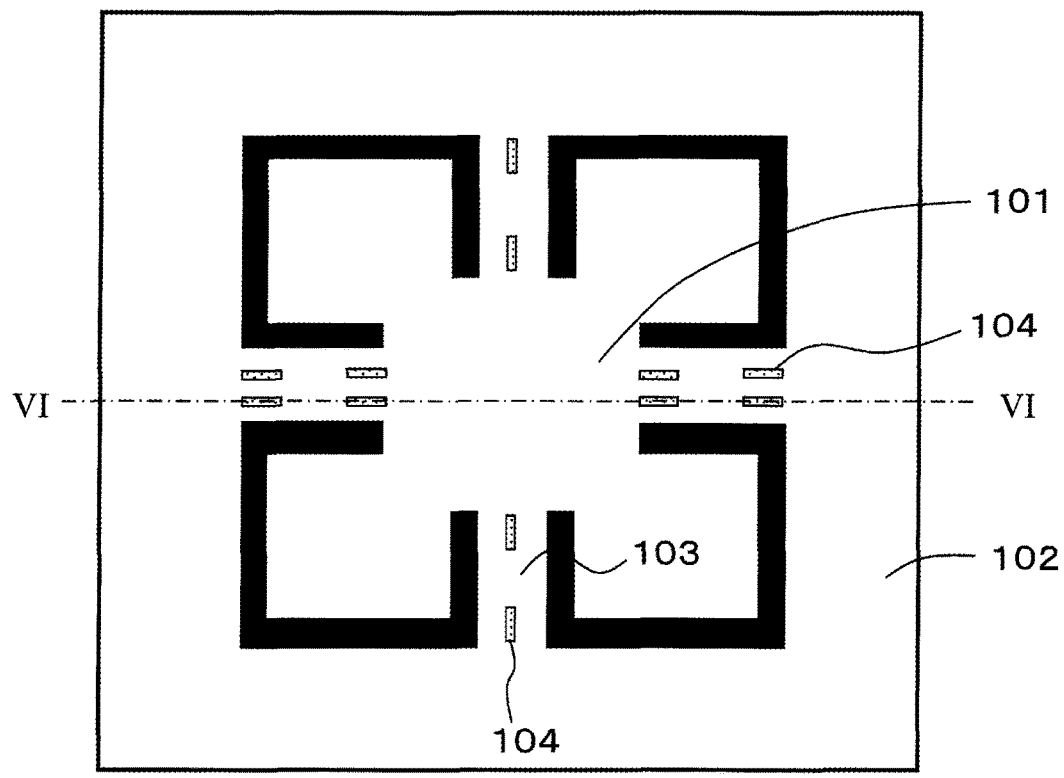
FIGS. 10A and 10B are a plan view and cross-sectional view showing a conventional sensor.
Figure 10B:
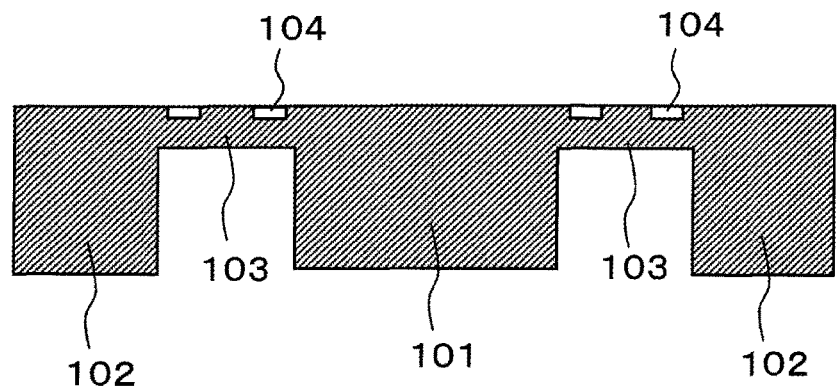

Note that, FIG. 8A and FIG. 8B are cross-sectional views corresponding to the cross-section taken along the line I-I in FIG. 1, and FIG. 8C is a top view. FIG. 9 is a cross-sectional view corresponding to the cross-section taken along the line I-I in FIG. 1.

(Process for Forming Detection Part)

First, as shown in FIG. 8A, a resistor film 51 is formed on the upper surface of the substrate 50. The substrate 50 is for example an SOI substrate and has a multilayer structure in which a first layer 50a made of Si, second layer 50b made of $SiO_2$, and third layer 50c made of Si are stacked in that order. The thicknesses of the layers are about 10 μm for the first layer 50a, about 1 μm for the second layer 50b, and about 500 μm for the third layer 50c.

The resistor film 51 is formed by implanting boron, arsenic, or the like into the major surface of the first layer 50a of the substrate 50 made of such an SOI substrate by the ion-implantation method. In the resistor film 51, for example, the impurity concentration at the surface of the first layer 50a is $1 \times 10^{18}$ atms/cm$^3$, and the depth is about 0.5 μm.

Next, as shown in FIG. 8B, portions of the resistor film 51 are removed, and this resistor film 51 is formed into the detection parts R which are formed at desired positions on the upper surface of the substrate 50 with desired shapes.

In this process, for example, a resist film is formed matching with the shapes of detection parts R on the resistor film 51, then the resistor film 51 which is exposed from the resist film is removed by RIE etching or other etching. After that, by removing the resist film, the detection parts R are formed on the upper surface of the substrate 50.

After forming the detection parts R, not shown lines and element side electrode pads which are connected to the detection parts R are formed. The lines and element side electrode pads are for example formed by forming a film of metal material such as aluminum by sputtering, then patterning it to predetermined shapes by dry etching or the like.

(Machining Process)

Next, the substrate 50 having the detection parts R formed thereon is machined to form the weight body 20, the frame 10 that surrounds the weight body 20, and beam parts 30 which have the detection parts R and in each of which the first end 31 is connected to the weight body 20 and the second end is connected to the frame 10.

Specifically, first, as shown in FIG. 8C, from the first layer 50a side of the substrate 50, the first layer 50a is patterned to the desired shapes (first patterning process). That is, a frame-shape first region A1, a second region A2 which is located on the inner side of the first region A1, and beam-shaped third regions A3 connecting the first region A1 and the second region A2 are determined, and regions which are located in the first layer 50a, but exclude the first to third regions A1, A2, and A3 are removed. Here, the detection parts R are arranged in the third regions A3.

Next, as shown in FIG. 9, from the third layer 50c side of the substrate 50, an annular groove 58 forming a closed space when viewed on a plane is formed at the inside of the first region A1. This groove 58 is provided between the first region A1 and the second region A2. It is formed by removing the third layer 50c and second layer 50b in the corresponding parts so that the lower surface of the first layer 50a is exposed. By forming the groove 58, a frame 10 which extends continuously from the periphery of the substrate 50 and is configured by a laminate of the first layer 50a, second layer 50b, and third layer 50c is formed. In other words, the frame 10 is separated from the other parts by the groove 58. When forming the groove 58, for example, by adjusting the etching rate or the like, the third layer 50c and second layer 50b are removed while leaving a portion of the third layer 50c and a portion of the second layer 50b so that they continue from the side surface of the frame 10. A portion of the third layer 50c and a portion of the second layer 50b which remain while continuing from the side surface of the frame 10 become the extending part 34 of the beam part 30.

Further, from the third layer 50c side of the substrate 50, when viewed on a plane, the second layer 50b is removed in the region from the inside of the first region A1 up to the second region A2, thereby forming a cavity 59 between the first layer 50a and the third layer 50c. By this cavity 59, the first layer 50a in the third region A3 is separated from the other parts in the thickness direction and becomes the beam-shaped beam parts 30. Single ends (second ends 32) of the beam parts 30 are connected by integral formation with the first layer 50a of the first region A1 (frame 10). The other ends (first ends 31) of the beam parts 30 are connected by integral formation with the first layer 50a of the second region A2 (weight body 20).

Further, by performing the above machining, a weight body 20 configured by the first layer 50a and second layer 50c which are located on the inner side from the cavity 59 when viewed on a plane and by the third layer 50c which is located on the inner side from the groove 58 when viewed on a plane is formed. Here, the second layer 50b which is located on the inner side from the cavity 59 when viewed on a plane functions as the joint portion 24.

Note that, in the weight body 20, a portion in the thickness direction of the third layer 50c may be removed so that the lower surface is located on the upper side compared with the lower surface of the frame 10.

Further, the machining of the substrate 50 can be realized by conventionally known semiconductor microprocessing technology, for example the photolithography process or deep dry etching.

By going through such processes, a sensor 100 is formed by machining a substrate 50 which is originally integrally formed. According to this, the connection strength between the frame 10 and weight body 20 and the beam parts 30 can be secured, therefore the reliability can be raised.

Further, as explained above, the sensor 100 is formed by machining the originally integrally formed substrate 50. According to this, the center of gravity of the weight body 20 can be set at a desired position with a high precision, therefore it becomes possible to provide a sensor 100 having a stable precision with a high productivity.

(Modification of Method of Production of Sensor 100)

The examples explained above were explained by using an example in which the resistor film 51 was formed, then the resistor film 51 was machined so as to form an atmospheric pressure detection part Rp and acceleration detection part Ra having desired shapes. However, the detection parts R may be formed by forming a resist film on the upper surface of the first layer 50a in advance, removing the resist film in regions in which the detection parts R are to be formed, and diffusing impurities at only desired positions (opening portions of the resist film) as well. In this case, the detection parts R become the same plane as the upper surface of the substrate 50, and there is no step. Therefore, the electrical connection of the lines to be connected to the detection parts R becomes easy.

EXAMPLES

The moment of inertia of area and resonance frequencies in the Y-direction and Z-direction when using the beam part 30D shown in FIG. 5 and FIG. 6 were found by simulation. The shape of the beam part 30D used in the simulation was set as follows.

Length in longitudinal direction (length in X-direction) of main part 33D and extending part 34D: 30 μm
  Width (length in Y-direction) of main part 33D: 100 μm
  Thickness (length in Z-direction) of main part 33D: 20 μm
  Width (length in Y-direction) of extending part 34D: 3 μm
  Thickness (length in Z-direction) of extending part 34D: 50 μm
  Attachment position of extending part 34D: Center in width direction (center in Y-direction) of main part 33D Further, as a comparative example, the moment of inertia of area and resonance frequencies in the Y-direction and Z-direction in the case where the beam was configured by only the main part 33D were computed by simulation.

As a result, they became as follows:

Working Example

Moment of inertia of area in Y-direction: $1.43e^{-18}$ μm$^4$
Resonance frequency in Y-direction: 999 kHz
Moment of inertia of area in Z-direction: $1.78e^{-18}$ μm$^4$
Resonance frequency in Z-direction: 1115 kHz Comparative Example Moment of inertia of area in Y-direction: $1.67e^{-18}$ μm$^4$
Resonance frequency in Y-direction: 1489 kHz
Moment of inertia of area in Z-direction: $6.7e^{-20}$ μm$^4$
Resonance frequency in Z-direction: 297 kHz From the above description, in the working example, by providing the extending part 34D, compared with the comparative example, the moment of inertia of area in the Y-direction (surface direction) can be made smaller, and the moment of inertia of area in the Z-direction (thickness direction) can be made larger. According to this, it was confirmed that in the working example, the resonance frequencies in the surface direction and in the thickness direction can be approached, and the difference of sensitivity between the surface direction and the thickness direction can be suppressed.

REFERENCE SIGNS LIST 10. frame
20. weight body
30. beam part
31. first end
32. second end
33. main part
34. extending part
34a. bonding surface
R. detection part
100. sensor

The invention claimed is:
1. A sensor comprising:
   a weight body,
   a frame surrounding the weight body, when viewed from above, and having a height,
   a beam part having flexibility and comprising a first end connected to the weight body and a second end connected to the frame, the first end and the second end defining a longitudinal direction, and
   a detection part on the beam part, which detects deformation of the beam part as an electric signal,
      wherein the beam part has a cross-sectional shape in a direction perpendicular to the longitudinal direction that is rectangular,
      an extending part which contacts a lower surface of the beam part and extends in a direction of the height of the frame, and
   a width, when viewed in cross section in a direction perpendicular to the longitudinal direction and in a plane of the height of the frame, of a side of the extending part that is in contact with the beam part is wider than a distal end of the extending part which extends in the direction of the height of the frame.
2. The sensor according to claim 1, wherein the extending part is joined to both of the beam part and a side surface of the frame on the second end.

3. The sensor according to claim 1, wherein the extending part is joined to both of the beam part and a side surface of the weight body on the first end.

4. The sensor according to claim 1, wherein the beam part comprises a first part and a narrow width part along the longitudinal direction, a length of the narrow width part in the width direction being shorter than a length of the first part in the width direction.

5. The sensor according to claim 4, wherein the extending part is located in the narrow width part.

6. The sensor according to claim 4, wherein the narrow width part is located at least at one of an end part on the first end and an end part on the second end.

7. The sensor according to claim 1, wherein the extending part is separate from the beam part and bonded to the beam part.

8. A sensor comprising:
a weight body,
a frame surrounding the weight body when viewed from above, and having a height,
a beam part having flexibility and comprising a first end connected to the weight body and a second end connected to the frame, the first end and the second end defining a longitudinal direction, and
a detection part on the beam part, which detects deformation of the beam part as an electric signal,
wherein the beam part extends in the longitudinal direction, and
an extending part which contacts a lower side of the beam,
when comparing with a case where the beam part does not comprise an extending part, an amount of increase of a moment of inertia of area in a thickness direction of the beam part is larger than an amount of increase of the moment of inertia of area in a surface direction of the beam part, and
a width, when viewed in cross section in a direction perpendicular to the longitudinal direction and in a plane of the height of the frame, of a side of the extending part that is in contact with the beam part is wider than a distal end of the extending part which extends in a direction of the height of the frame.

9. The sensor according to claim 8, wherein the extending part is joined to both of the beam part and a side surface of the frame on the second end.

10. The sensor according to claim 8, wherein the extending part is joined to both of the beam part and a side surface of the weight body on the first end.

11. The sensor according to claim 8, wherein the beam part comprises a first part and a narrow width part along the longitudinal direction, a length of the narrow width part in the width direction being shorter than a length of the first part in the width direction.

12. The sensor according to claim 11, wherein the extending part is located in the narrow width part.

13. The sensor according to claim 11, wherein the narrow width part is located at least at one of an end part on the first end and an end part on the second end.

14. The sensor according to claim 8, wherein the extending part is separate from the beam part and bonded to the beam part.

* * * * *